(12) United States Patent
Chen

(10) Patent No.: US 8,071,450 B2
(45) Date of Patent: *Dec. 6, 2011

(54) METHOD FOR FORMING VOLTAGE SUSTAINING LAYER WITH OPPOSITE-DOPED ISLANDS FOR SEMICONDUCTOR POWER DEVICES

(75) Inventor: Xing-Bi Chen, Sichuan (CN)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 153 days.

This patent is subject to a terminal disclaimer.

(21) Appl. No.: 12/355,165

(22) Filed: Jan. 16, 2009

(65) Prior Publication Data

US 2009/0130828 A1    May 21, 2009

Related U.S. Application Data

(60) Division of application No. 11/838,522, filed on Aug. 14, 2007, now Pat. No. 7,498,614, which is a continuation of application No. 11/365,223, filed on Mar. 1, 2006, now Pat. No. 7,271,067, which is a division of application No. 10/860,435, filed on Jun. 3, 2004, now Pat. No. 7,227,197, which is a division of application No. 10/382,027, filed on Mar. 5, 2003, now Pat. No. 6,936,867, which is a division of application No. 08/953,077, filed on Oct. 17, 1997, now Pat. No. 6,635,906, which is a continuation of application No. 08/598,386, filed on Feb. 8, 1996, now abandoned, which is a continuation of application No. 08/268,339, filed on Jun. 30, 1994, now abandoned.

(30) Foreign Application Priority Data

Oct. 29, 1993    (CN) .................................. 93 1 15356

(51) Int. Cl.
*H01L 21/336*    (2006.01)

(52) U.S. Cl. .......................... 438/269; 438/139; 438/140
(58) Field of Classification Search .......... 438/139–140, 438/268–269
See application file for complete search history.

(56) References Cited

U.S. PATENT DOCUMENTS 3,404,295 A    10/1968    Warner, Jr.
(Continued)

FOREIGN PATENT DOCUMENTS

JP    52-038889 A    3/1977

OTHER PUBLICATIONS

Chenming Hu; Optimum Doping Profile for minimum Ohmic Resistance and High-Breakdown Voltage; IEEE Transactions on Electron Devices, vol. ED-26, No. 3, pp. 243-244; Mar. 1979.
Victor A.K. Temple et al.; A 600-Volt MOSFET Designed for Low On-Resistance; IEEE Transactions on Electron Devices, vol. ED-27, No. 2, pp. 343-349; Feb. 1980.

(Continued)

*Primary Examiner* — Ori Nadav
(74) *Attorney, Agent, or Firm* — Panitch Schwarze Belisario & Nadel LLP

(57) ABSTRACT

A method of manufacturing a semiconductor device includes preparing a semiconductor wafer with a substrate of a first conductivity type and forming a first epitaxial layer of the first conductivity type on the substrate. The first epitaxial layer has a first thickness. The method further includes growing a first oxide layer on the first epitaxial layer, masking the first oxide layer, ion implanting to create at least one embedded region of a second conductivity type in the first epitaxial layer, removing the first oxide layer, and forming a second epitaxial layer of the first conductivity type on the first epitaxial layer. The second epitaxial layer has the first thickness minus a thickness equal to a thickness of the at least one embedded region of the second conductivity type.

3 Claims, 5 Drawing Sheets

U.S. PATENT DOCUMENTS

| | | | |
|---|---|---|---|
| 3,497,777 | A | 2/1970 | Teszner |
| 3,564,356 | A | 2/1971 | Wilson |
| 4,754,310 | A | 6/1988 | Coe |
| 4,775,881 | A | 10/1988 | Ploog et al. |
| 4,821,095 | A | 4/1989 | Temple |
| 4,868,624 | A | 9/1989 | Grung et al. |
| 5,027,180 | A | 6/1991 | Nishizawa et al. |
| 5,105,243 | A | 4/1992 | Nakagawa et al. |
| 5,216,275 | A | 6/1993 | Chen |
| 5,218,226 | A | 6/1993 | Slatter et al. |
| 5,219,777 | A | 6/1993 | Kang |
| 5,389,815 | A | 2/1995 | Takahashi |
| 5,418,376 | A | 5/1995 | Muraoka et al. |
| 5,430,311 | A | 7/1995 | Murakami et al. |
| 5,438,215 | A | 8/1995 | Tihanyi |
| 5,510,287 | A | 4/1996 | Chen et al. |
| 5,519,245 | A | 5/1996 | Tokura et al. |
| 5,572,048 | A | 11/1996 | Sugawara |
| 6,011,298 | A | 1/2000 | Blanchard |
| 6,066,878 | A | 5/2000 | Neilson |
| 6,635,906 | B1 | 10/2003 | Chen |
| 6,936,867 | B2 | 8/2005 | Chen |
| 7,227,197 | B2 | 6/2007 | Chen |
| 7,271,067 | B2 | 9/2007 | Chen |
| 7,498,614 | B2 | 3/2009 | Chen |

OTHER PUBLICATIONS

Xing-Bi Chen et al.; Optimum Doping Profile of Power MOSFET; IEEE Transactions on Electron Devices, vol. ED-29, No. 6, pp. 985-987; Jun. 1982.

P. Rossel; Power M.O.S. Devices; Microelectron, Reliab., vol. 24, No. 2, pp. 359-366; 1984.

Fujihira, Tatsuhiko, "Theory of Semiconductor Superjunction Devices," Jpn. J. Appl. Phys., vol. 36, pp. 6254-6262 (1997).

Yamauchi et al., "Electrical Properties of Super Junction p-n-Diodes Fabricated by Trench Filling," 15th International Symposium on Power Semiconductor Devices and ICs, pp. 207-210 (2003).

Saito et al., "600V Semi-superjunction MOSFET," Papers of Technical Meeting on Electron Devices, IEE Japan, vol. Ed. 03, No. 44-49, pp. 27-30 (2003).

Daniel et al., "Modeling of the CoolMOS Transistor—Part I: Device Physics," IEEE Transactions on Electron Devices, vol. 49, No. 5, pp. 916-922 (May 2002).

Daniel et al., "Modeling of the CoolMOS Transistor—Part II: DC Model and Parameter Extraction," IEEE Transactions on Electron Devices, vol. 49, No. 5, pp. 923-929 (May 2002).

Mawby, PA, "MOS Devices," IGDS Course, University of Wales Swansea (2003).

Bai et al., "Junction Termination Technique for Super Junction Devices," Center for Power Electronics Systems (2000).

FIG. 1A  FIG. 1B

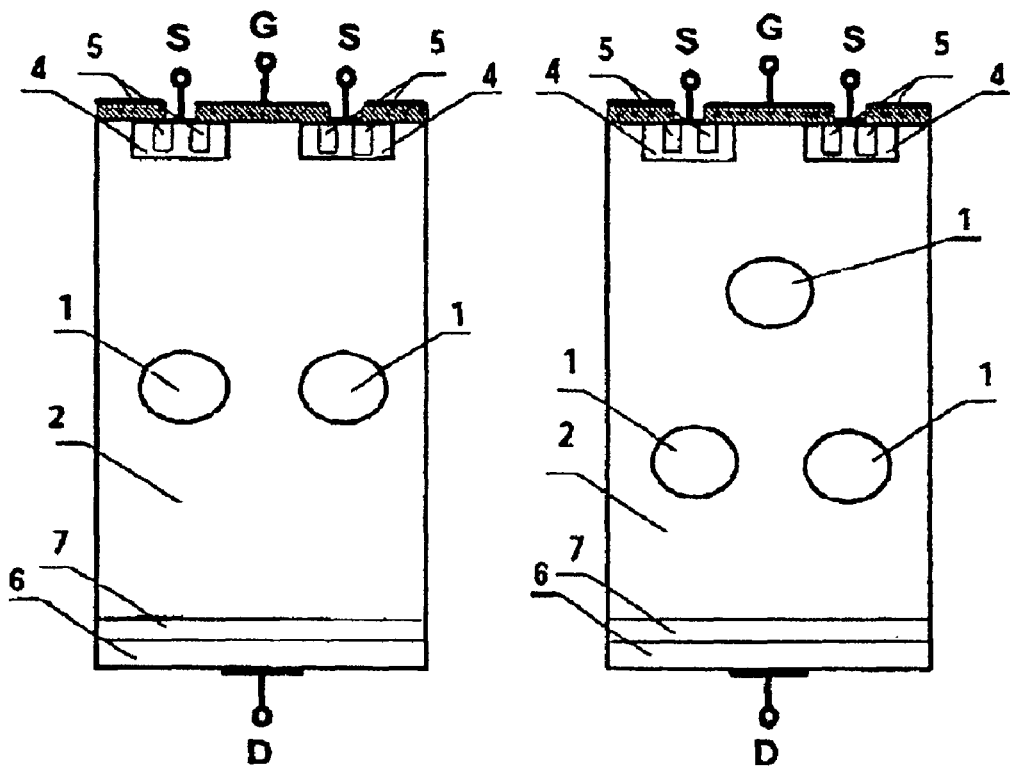
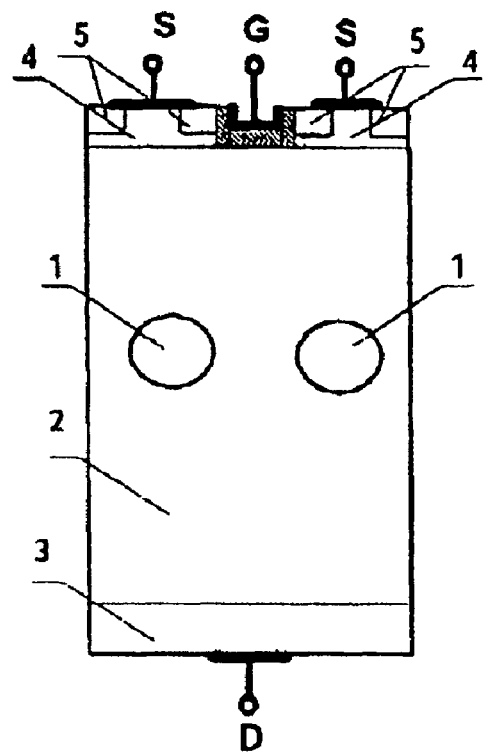
FIG. 4A  FIG. 4B
FIG. 5

METHOD FOR FORMING VOLTAGE SUSTAINING LAYER WITH OPPOSITE-DOPED ISLANDS FOR SEMICONDUCTOR POWER DEVICES

CROSS-REFERENCE TO RELATED APPLICATIONS

This application is a divisional application of U.S. patent application Ser. No. 11/838,522, filed Aug. 14, 2007, now U.S. Pat. No. 7,498,614; which is a continuation of U.S. patent application Ser. No. 11/365,223, filed Mar. 1, 2006, now U.S. Pat. No. 7,271,067; which is a divisional application of U.S. patent application Ser. No. 10/860,435, filed Jun. 3, 2004, now U.S. Pat. No. 7,227,197; which is a divisional application of U.S. patent application Ser. No. 10/382,027, filed Mar. 5, 2003, now U.S. Pat. No. 6,936,867; which is a divisional application of U.S. patent application Ser. No. 08/953,077, filed Oct. 17, 1997, now U.S. Pat. No. 6,635,906; which is a continuation of U.S. patent application Ser. No. 08/598,386, filed Feb. 8, 1996, now abandoned; which is a continuation of U.S. patent application Ser. No. 08/268,339, filed Jun. 30, 1994, now abandoned.

BACKGROUND OF THE INVENTION

This invention relates to semiconductor high voltage devices, and specifically to semiconductor high voltage devices with a voltage sustaining layer containing floating regions.

It is well-known that in many semiconductor devices, such as VD-MOST and SIT, a high sustaining voltage always accompanies a high specific on-resistance. This is due to the fact that, for a high sustaining voltage, thickness of a voltage sustaining layer should be large and doping concentration of the voltage sustaining layer should be low, so as the peak field does not exceed the critical field for breakdown $-E_C$, which is normally expressed by $E_C=8.2\times10^5\times V_B^{-0.2}$ V/cm for silicon, where $V_B$ is the breakdown voltage of the voltage sustaining layer.

In a uniformly doped n-type voltage sustaining layer between p+-region and n+-region, in order to obtain a minimum specific on-resistance at a given breakdown voltage, a doping concentration $N_D$ and a thickness W of the voltage sustaining layer are optimized such that a maximum field is at p+-n-junction and its value is equal to $E_C$, a minimum field is at n+-n-junction and equal to $E_C/3$. For a silicon device, $$N_D=1.9\times10^{18}\times V_B^{-1.4}\text{ cm}^{-3} \quad (1)$$

$$W=1.8\times10^{-2}\times V_B^{1.2} \mu m^{-2} \quad (2)$$

(see, e.g., P. Rossel, Microelectron. Reliab., vol. 24, No. 2, pp 339-366, 1984).

For the VDMOST shown in FIG. 1A, a field profile in the voltage sustaining layer at $V_B$ is shown in FIG. 1B, where a slope of the field versus distance is $qN_D/E_s$, $E_s$ is the permittivity of the semiconductor and q is the electron charge. The change of field through the n-region is $qN_D/E_s$, $2E_C/3$. The relation between $R_{on}$ and $V_B$ of a n-type voltage sustaining layer is then expressed by $$R_{on}=W/q\mu_n N_D=0.83\times10^{-8}\times V_B^{2.5} \Omega\text{cm}^2 \quad (3)$$

where $\mu_n$ is the mobility of the electron and $\mu_n=710\times V_B^{0.1}$ cm/V.sec is used for silicon.

In order to get even lower $R_{on}$ at a given $V_B$, some research has been done to optimize the doping profile instead of using a uniform doping, see: [1] C. Hu, IEEE Trans. Electron Devices, vol. ED-2, No. 3, p 243 (1979); [2] V. A. K. Temple et al., IEEE Trans. Electron Devices, vol. ED-27, No. 2, p 243 (1980); [3] X. B. Chen, C. Hu, IEEE Trans. Electron Devices, vol. ED-27, No. 6, p 985-987 (1982). However, the results show no significant improvement.

BRIEF SUMMARY OF THE INVENTION

The purpose of this invention is to provide a semiconductor high voltage device having a new voltage sustaining layer with better relationship between $R_{on}$ and $V_B$. To achieve the above purpose, a semiconductor high voltage device is provided, which comprises a substrate of a first conductivity type, at least one region of a second conductivity type, and a voltage sustaining layer of the first conductivity type having a plurality of discrete floating (embedded) islands of a second conductivity type between said substrate and said region of the second conductivity type.

According to this invention, an n (or p) type voltage sustaining layer is divided by (n-1) planes into n sub-layers with equal thickness, and p (or n) type discrete floating islands are introduced with their geometrical centers on such planes. The average dose $N_T$ of the floating islands in each plane is about $2E_sEc/3q$. For silicon, $$N_T=2E_sE_c/3q=3.53\times10^{12}V_B^{-0.2}\text{ cm}^{-2} \quad (4)$$

With such a floating island, the field is reduced by an amount about $2E_C/3$ from a maximum value $E_C$ at a side of the floating island to a minimum value $E_C/3$ at another side of the floating island so far as the floating island is fully depleted. Each sub-layer is designed to sustain a voltage of $V_{B1}=V_B/n$, and to have a thickness and doping concentration which are almost the same as those form formulas (1) and (2) with $V_B$ is replaced by $V_{B1}$, so that when a reverse voltage which is about the breakdown voltage $V_B$ is applied over the whole voltage sustaining layer, the maximum field is $E_C$ and the minimum field is $E_C/3$, where the locations of the maximum field are not only at the p+-n (or n+-p) junction, but also at the points of each p (or n) island nearest to the n+-n (or p+-p) junction; the locations of the minimum field are not only at the n+-n (or p+-p) junction, but also at the points of each p (or n) islands nearest to the p+-n (or n+-p) junction. An example of the structure of a VDMOST using a voltage sustaining layer of this invention with n=2 is shown in FIG. 3A and the field profile under a reverse voltage of $V_B$ is shown in FIG. 3B. Apparently, in such a condition, $V_B=2WE_C/3$, where W is the total thickness of the voltage sustaining layer.

It is easy to prove that the above structured voltage sustaining layer including a plurality of floating regions is fully depleted under a reverse bias voltage about $V_B/2$. The flux due to the charges of the ionized donors (or acceptors) under the p (or n) islands are almost totally terminated by the charges of the p (or n) islands. The maximum field is then $2E_C/3$ and the minimum field is zero, the locations of the maximum field are the same as those under a reverse bias voltage of $V_B$.

Apparently, the p (or n) islands make the field not to be accumulated throughout the whole voltage sustaining layer. For a given value of breakdown voltage $V_B$, the doping concentration $N_D$ can be higher than that in a conventional voltage sustaining layer and the specific on-resistance is much lower than that in a conventional voltage sustaining layer.

Suppose that there are n sub-layers in a voltage sustaining layer. Then, each sub-layer can sustain a voltage of $V_B/n$, where $V_B$ is the breakdown voltage of the total voltage sustaining layer. Obviously, instead of (3), the relation of $R_{on}$ and $V_B$ of this invention is $$R_{on} = n \times 0.83 \times 10^{-8} (V_B/n)^{2.5} \ddot{y} \cdot cm^2 \quad (5)$$

$$= 0.83 \times 10^{-8} V_B^{2.5}/n^{1.5} \ddot{y} \cdot cm^2$$

Compared to formula (3), it can been seen that the on-resistance of a voltage sustaining layer having n sub-layers is much lower than that of a conventional one.

The inventor has experimented and obtained remarkable results, which show that the on-resistance of a semiconductor device using a voltage sustaining layer with n=2 of this invention is at least lower than ½ of that of a conventional one with the same breakdown voltage, although the real value of $R_{on}$ of a voltage sustaining layer having floating islands is a little higher than the value calculated from expression (5) when n<3, due to the effect that the current path is narrowed by the p-type floating islands. Besides, for minimizing $R_{on}$, the optimum value of $N_T$ is slightly different with the expression (4), due to that the negative charges of p-type floating islands are concentrated in the p-regions instead of being uniformly distributed on a plane, whereas these negative charges are used to absorb the flux of ionized donors below that plane.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1A shows the structure and FIG. 1B shows the field profile.

FIG. 2 shows a voltage sustaining layer structure of this invention, where

FIG. 3 shows the structure and the field profile of a VDMOST with the voltage sustaining layer of this invention.

FIG. 4 shows the structure of an IGBT with a voltage sustaining layer of this invention. In FIG. 4A, a voltage sustaining layer of FIG. 2A is used. In FIG. 4B, a voltage sustaining layer of FIG. 2C is used.

FIG. 5 shows a structure of a RMOST with the voltage sustaining layer of this invention shown in FIG. 2A.

DETAILED DESCRIPTION OF THE INVENTION

All the structures schematically shown in the figures are of cross-sectional view. In FIGS. 3-7, the same numeral designates similar parts of a high voltage semiconductor device, where, 1 designates p (or n) island in the voltage sustaining layer; 3 designates n+ (or p+) substrate; 4 designates p (or n) source body; 5 designates n+ (or p+) source; 6 designates p+ (or n+) substrate; 7 designates n (or p) buffer layer; 8 designates p+ (or n+) outer base of BJT; 9 designates p+ (or n+) grid of SIT; and shaded regions designate oxide regions.

FIG. 2 shows several structures of a voltage sustaining layer according to the invention.

Figure 1:
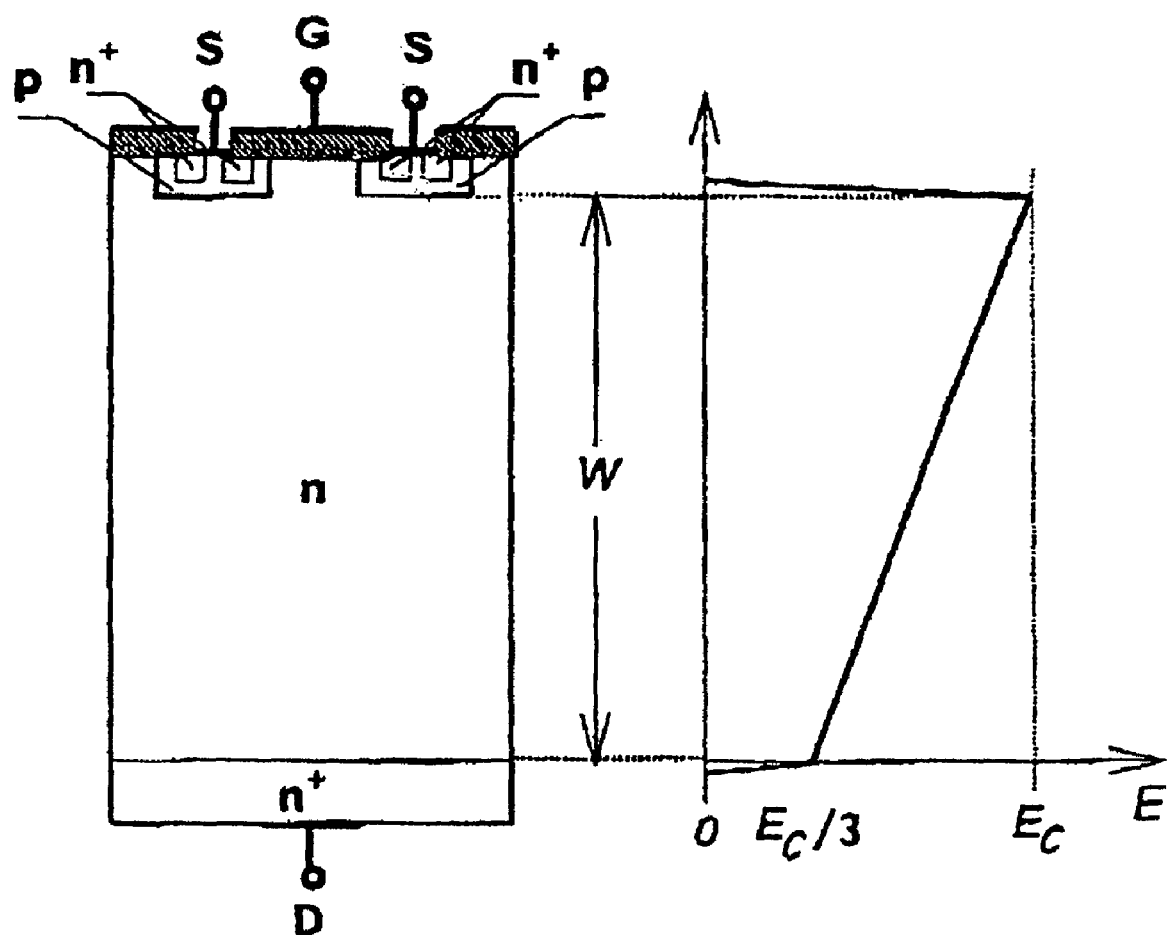
FIG. 1 is the schematic diagram of a prior art VDMOST, where
Figure 2A:
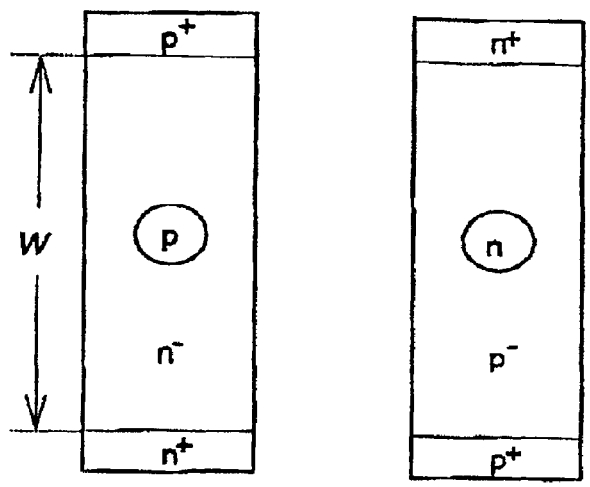
FIG. 2A shows a voltage sustaining layer structure with islands in one plane.
Figure 2B:
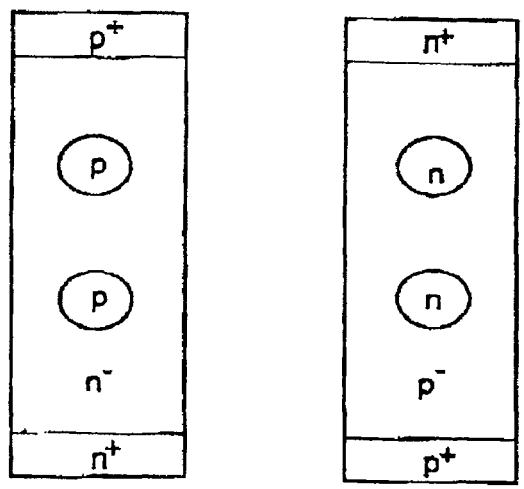
FIGS. 2B and 2C show the structures of the voltage sustaining layer with the floating islands in two planes.
Figure 2C:
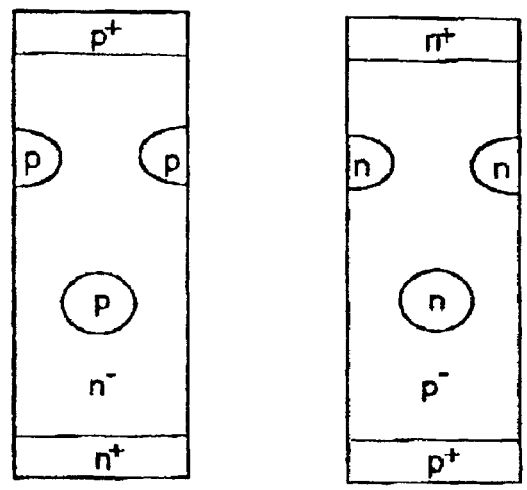

In FIG. 2A, a voltage sustaining layer with p (or n) islands in a plane is shown (i.e., n=2, two sub-layers). In FIG. 2B, a voltage sustaining layer with p (or n) islands disposed in two planes is shown (i.e., n=3, three sub-layers), where each island in the upper plane is vertically arranged over a corresponding island in the lower plane. FIG. 2C shows another voltage sustaining layer with two planes of p (or n) islands (n=3), wherein each of the islands in the upper plane is vertically arranged in the middle of two neighboring islands in the lower plane.

The horizontal layout of the voltage sustaining layer can be either interdigitated (finger), or hexagonal (cell), or rectangular (cell). In all the figures of schematic cross-sectional view of the structures, only one or two units (fingers or cells) of the voltage sustaining layer are shown.

The voltage sustaining layer of this invention can be used in many high voltage devices.

1) High voltage diode

This can be simply realized by forming two electrodes on the p+-region and the n+-region in any of structures shown in FIG. 2.

2) High voltage (or power) VDMOST

Figures 3A, 3B:
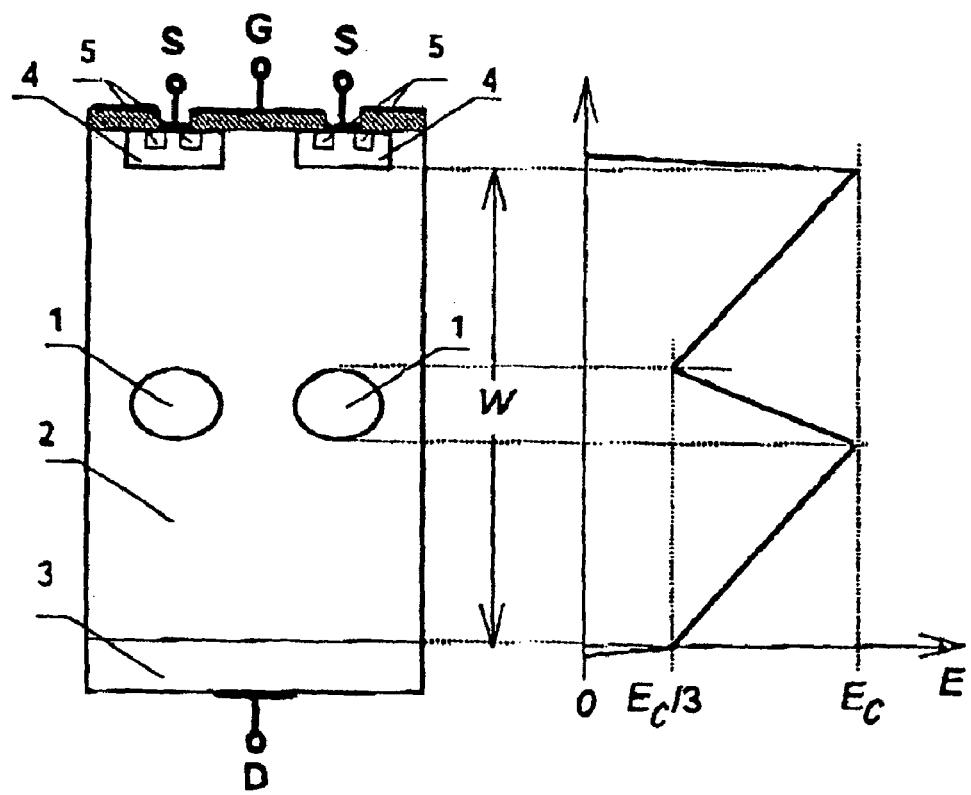
In FIG. 3A, the voltage sustaining layer of FIG. 2A is used. The field profile of this structure under a reverse voltage of $V_B$ is shown in FIG. 3B.
Figure 3C:
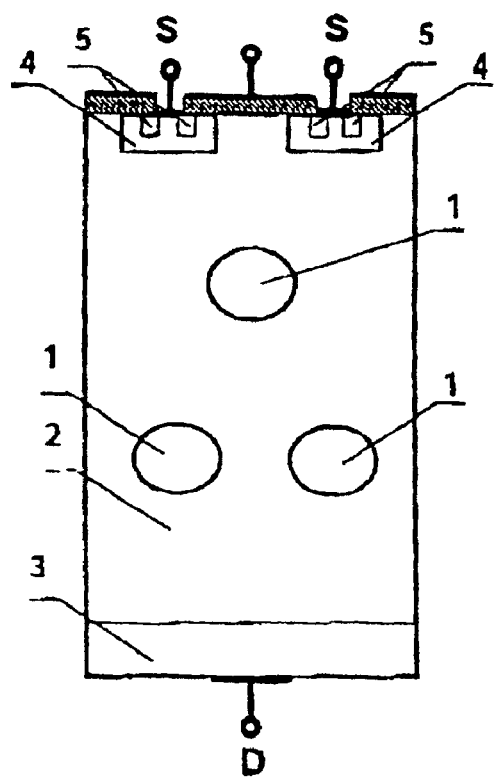
In FIG. 3C, a voltage sustaining layer of FIG. 2C is used.

FIG. 3A shows a structure of a vertical diffusion metal oxide semiconductor transistor (VDMOS or VDMOST) using the voltage sustaining layer with a plurality of floating islands disposed in one plane, i.e., n=2. FIG. 3B shows the field profile along a line through a center of islands in the voltage sustaining layer and perpendicular to said planes in FIG. 3A. FIG. 3C shows a structure of a VDMOST using a voltage sustaining layer with islands in two planes, i.e., n=3.

The turn-off process of a resultant device is almost as fast as a conventional VDMOST. The turn-on process is like the turn-off process of a conventional IGBT, which consists of a fast stage and a long tail. The long tail is due to the p (or n) islands needing to be charged.

3) High Voltage (or Power) IGBT

FIG. 4A shows a structure of an IGBT using a voltage sustaining layer with n=2. FIG. 4B shows a structure of an IGBT using a voltage sustaining layer with n=3. In order to improve the turn-on process of a VDMOST with the voltage sustaining layer of this invention, only a small amount of minorities is needed to charge the islands in the voltage sustaining layer. This can be done by using an IGBT structure with a very low injection. Investigations by the inventor indicate that an injection ratio of less than 0.1 is enough to make the turn-on process to be almost as fast as the turn-off process and results in no long tail. The low injection ratio makes the device operate dominantly by the majority carriers.

4) High Voltage (or Power) RMOST

FIG. 5 shows a structure of an RMOST using a voltage sustaining layer of this invention, where n=2.

5) High Voltage (or Power) BJT

Figure 6:
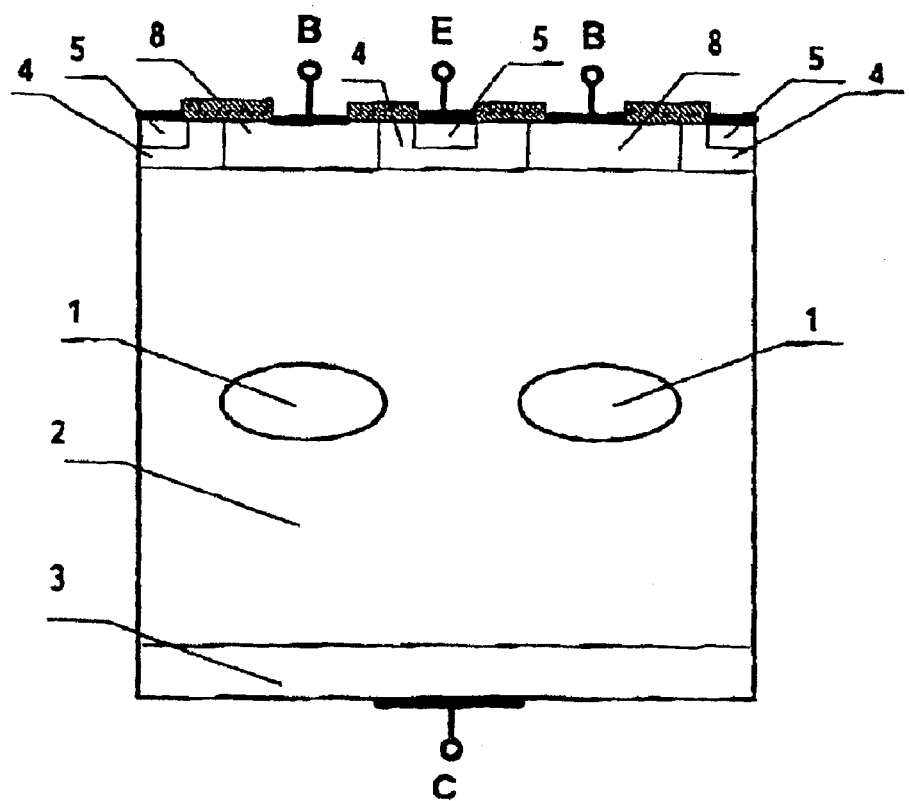
FIG. 6 shows a structure of a bipolar junction transistor with the voltage sustaining layer of this invention shown in FIG. 2A.

FIG. 6 shows a structure of a bipolar junction transistor using a voltage sustaining layer of this invention, where n=2.

6) High Voltage (or Power) SIT

Figure 7:
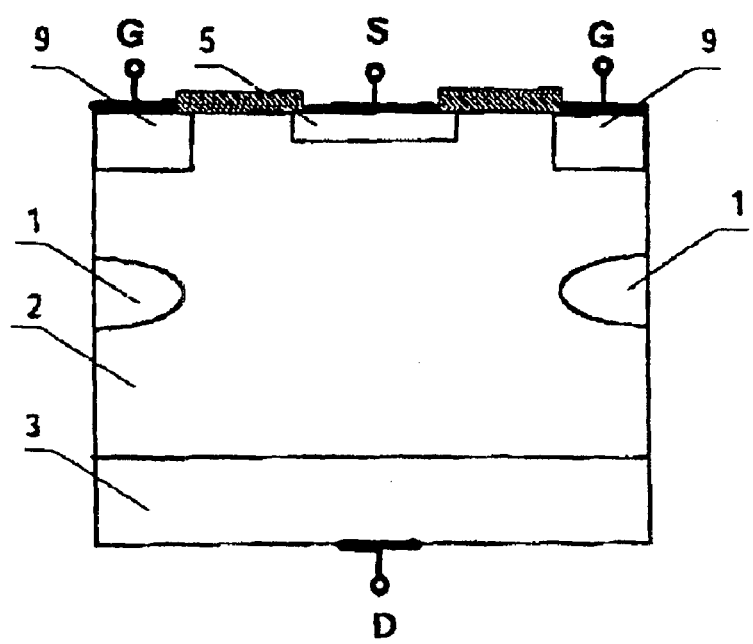
FIG. 7 shows a structure of a SIT with the voltage sustaining layer of this invention shown in FIG. 2A.

FIG. 7 shows a structure of a static induction transistor using a voltage sustaining layer of this invention, where n=2.

The design references of a voltage sustaining layer of this invention may be calculated according to above formulas for calculating $E_C$ and the average dose of the islands in a plane. For example, at first, a value of a desirable breakdown voltage $V_B$ is determined, and the value of $E_C$ is calculated from the determined $E_C$. Then, from the technology achievable number of sublayers n, the lateral size of a unit and the width of the islands in a plane, the number of impurity atoms in each island is calculated. The calculated values can be used as the reference values for simulation in CAD if more accurate values are needed.

An example of a process for making a vertical n-IGBT using the voltage sustaining layer of this invention is stated briefly as follows:

First step: preparing a wafer of a p+-substrate having an n+-buffer on it;

Second step: forming a n-epilayer on said wafer;

Third step: growing a thin oxide layer on the epilayer and forming openings by photo-lithograph;

Fourth step: implanting boron through the openings for making p-islands and then removing the oxide layer;

Fifth step: repeat (n-1) times of second step to fourth step. The following steps are all the same as fabricating a conventional IGBT.

Although the invention has been described and illustrated with reference to specific embodiments thereof, it is not intended that the invention be limited to these illustrative embodiments. Those skilled in the art will recognized that modifications and variations can be made without departing from the spirit of the invention. Therefore, it is intended that this invention encompass all such variations and modifications as fall within the scope of the appended claims.

I claim:

1. A method of manufacturing a semiconductor device comprising:

preparing a semiconductor wafer with a substrate of a first conductivity type;

forming a first epitaxial layer of the first conductivity type on the substrate, the first epitaxial layer having a first thickness;

growing a first oxide layer on the first epitaxial layer;

masking the first oxide layer;

ion implanting to create at least one first embedded region of a second conductivity type in the first epitaxial layer;

removing the first oxide layer;

forming a second epitaxial layer of the first conductivity type on the first epitaxial layer, the second epitaxial layer having a second thickness that is greater than the first thickness minus a thickness equal to a thickness, in a direction extending away from the substrate, of the at least one first embedded region of the second conductivity type;

growing a second oxide layer on the second epitaxial layer;

masking the second oxide layer;

ion implanting to create at least one second embedded region of a second conductivity type in the second epitaxial layer; and removing the second oxide layer.

2. The method according to claim 1, wherein the first conductivity type is one of n-type and p-type and the second conductivity type is the other of n-type and p-type.

3. The method according to claim 1, wherein the substrate has a first doping concentration and the first epitaxial layer and the second epitaxial layer have a second doping concentration that is different from the first doping concentration.

* * * * *